United States Patent [19]
Taga et al.

[11] Patent Number: 5,654,666
[45] Date of Patent: Aug. 5, 1997

[54] HIGH INPUT RESISTANCE CIRCUIT WITH BASE CURRENT COMPENSATION AND METHOD OF COMPENSATING BASE CURRENT

[75] Inventors: Naoki Taga; Kenji Seki, both of Tokyo, Japan

[73] Assignee: NEC Corporation, Tokyo, Japan

[21] Appl. No.: 509,672

[22] Filed: Jul. 31, 1995

[30] Foreign Application Priority Data

Aug. 4, 1994 [JP] Japan .................................. 6-182682

[51] Int. Cl.$^6$ .............................. H03F 3/45; H03F 1/34
[52] U.S. Cl. ........................... 327/563; 327/378; 327/54; 330/259
[58] Field of Search ............................ 327/563, 562, 327/561, 560, 54, 53, 378; 330/259

[56] References Cited

U.S. PATENT DOCUMENTS

| | | |
|---|---|---|
| 4,308,504 | 12/1981 | Ida ........................... 330/259 |
| 4,462,002 | 7/1984 | Schade, Jr. ................ 330/257 |
| 4,577,336 | 3/1986 | Kriedt et al. ............... 327/311 |
| 4,881,045 | 11/1989 | Dillman ..................... 330/253 |
| 4,933,645 | 6/1990 | Kasai ......................... 330/255 |
| 5,034,700 | 7/1991 | Herrmann et al. ......... 330/259 |
| 5,430,765 | 7/1995 | Nagahori .................... 330/259 |
| 5,475,338 | 12/1995 | Yamaguchi ................. 327/563 |

FOREIGN PATENT DOCUMENTS

| | | | |
|---|---|---|---|
| 52-15252 | 4/1977 | Japan ......................... | 330/259 |
| 54-139362 | 10/1979 | Japan ......................... | 330/259 |
| 61-261907 | 11/1986 | Japan ......................... | 330/259 |
| 2246604 | 10/1990 | Japan ......................... | 330/259 |

*Primary Examiner*—Timothy P. Callahan
*Assistant Examiner*—Terry L. Englund
*Attorney, Agent, or Firm*—Sughrue, Mion, Zinn, Macpeak & Seas

[57] ABSTRACT

A high input resistance circuit that produces an output signal with a voltage gain of unity includes an input section, a feedback section, a high input resistance amplification section, and an output section. In the input section, transistors $1_a$ and $1_b$ form a differential amplification circuit using transistors $2_a$ and $2_b$ as emitter resistors, respectively. A feedback circuit is formed by transistors $3_a$ and $3_b$ whose collectors are connected to bases of transistors $1_a$, $1_b$, respectively, and whose emitters are connected to the collector of transistor $8_b$ of the output section. The bases of transistors $3_a$ and $3_b$ are provided a bias from a bias terminal 106 so as to suppress a collector current. In the high input resistance amplification section, transistors $4_a$ and $4_b$ form an emitter follower circuit using transistors $5_a$, $5_b$ and resistors $R_1$, $R_2$ as emitter resistors, respectively. In the output section, transistors $6_a$ and $6_b$ form a differential amplification circuit, wherein the collectors of transistors $6_a$ and $6_b$ are connected to a current mirror circuit having transistors $8_a$ and $8_b$, and the emitters of transistors $6_a$ and $6_b$ are connected to an emitter load resistor consisting of transistors $7_a$, $7_b$ and resistors $R_4$, $R_5$.

17 Claims, 2 Drawing Sheets

HIGH INPUT RESISTANCE CIRCUIT WITH BASE CURRENT COMPENSATION AND METHOD OF COMPENSATING BASE CURRENT

BACKGROUND OF THE INVENTION

This invention relates to an art of a semiconductor integrated circuit and, more particularly, to the semiconductor integrated circuit which compensates a base current for realizing high input resistance.

A conventional method of enhancing input resistance of a semiconductor integrated circuit has been used by which the base current is compensated.

The method of compensating the base current has been disclosed in the Japanese Patent Laid-open No. 169108 (1991).

FIG. 2 shows a circuit of the aforementioned prior art.

Referring to FIG. 2, reference codes 21 and 25 to 28 denote NPN transistors. Reference codes 22 to 24 and 29 denote PNP transistors. Reference codes 30 and 31 denote diodes. Reference codes 32 and 33 denote constant current sources. Reference codes 34 and 35 denote resistors.

In FIG. 2, a high voltage power is supplied by a terminal 53. A low voltage power is supplied by a terminal 56. Terminals 51 and 52 are used as input terminals. Terminals 54 and 55 are used as output terminals.

Supposing that the current amplification factor of NPN transistors 21 and 25 to 28 is $\beta$ and a current amplification factor of PNP transistors 22 to 24 and 29 is $\beta'$, and a current from the constant current source 33 is $I_1$, base currents $i_7$ and $i_8$ of the NPN transistors 27 and 28 are derived from the following equation (1) when input voltage between terminals 51 and 52 measures 0.

$$i_7 = i_8 = \frac{1}{2(\beta + 1)} \times I_1 \quad (1)$$

If the current of the constant current source 32 is set to $I_1$ in the same manner as the constant current source 33, a base current $i_1$ of the NPN transistor 21 is derived from the following equation (2).

$$i_1 = \frac{1}{\beta + 1} \times I_1 \quad (2)$$

The PNP transistors 22 to 24 and 29 form a current mirror circuit. If those PNP transistors 22 to 24 and 29 are provided with the same characteristics, collector currents $i_2$, $i_3$ and $i_9$ of the PNP transistors 22, 23 and 29, respectively are derived from the following equation (3).

$$i_2 = i_3 = i_9 = \frac{I_1}{\beta + 1} \times \frac{\beta'(\beta' + 1)}{\beta'(\beta' + 1)} \quad (3)$$

Base currents $i_5$ and $i_6$ from the NPN transistors 25 and 26, respectively are derived from the following equation (4).

$$i_5 = i_6 = \frac{\beta}{2(\beta + 1)^2} \times I_1 \cong \frac{1}{2(\beta + 2)} \times I_1 \quad (4)$$

An input bias current $I_B$ at each of the terminals 52 and 53 is derived from the equation (5).

$$I_B = i_7 + i_6 - i_9 = \left[ \frac{6}{\beta'(\beta' + 1) + 3} - \frac{1}{\beta + 2} \right] \times \frac{I_1}{2(\beta + 1)} \quad (5)$$

If the current amplification factors $\beta$ and $\beta'$ are set to preset values, the bias current is minimized and high input resistance is realized.

SUMMARY OF THE INVENTION

It is an object of the present invention to provide a semiconductor integrated circuit which sufficiently suppresses an input current of an input terminal and realizes stable high input resistance.

It is another object of the present invention to provide a semiconductor integrated circuit where a potential of the input terminal is the same as that of the output terminal and a gain of 1 is obtained.

It is a further object of the present invention to provide a semiconductor integrated circuit which realizes a high input resistance with minimized bias current.

The above objects of the present invention are achieved by a semiconductor integrated circuit comprising an input section for amplifying an input signal, a high input resistance section for setting a voltage gain of the input section to approximately 1, an output section for negatively feeding back an output of the high input resistance section, and a feedback section for suppressing the current flowing from the input section by supplying a preset bias in accordance with voltage of the signal negatively fed back.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

Next, the present invention is described, referring to drawings.

Figure 1:
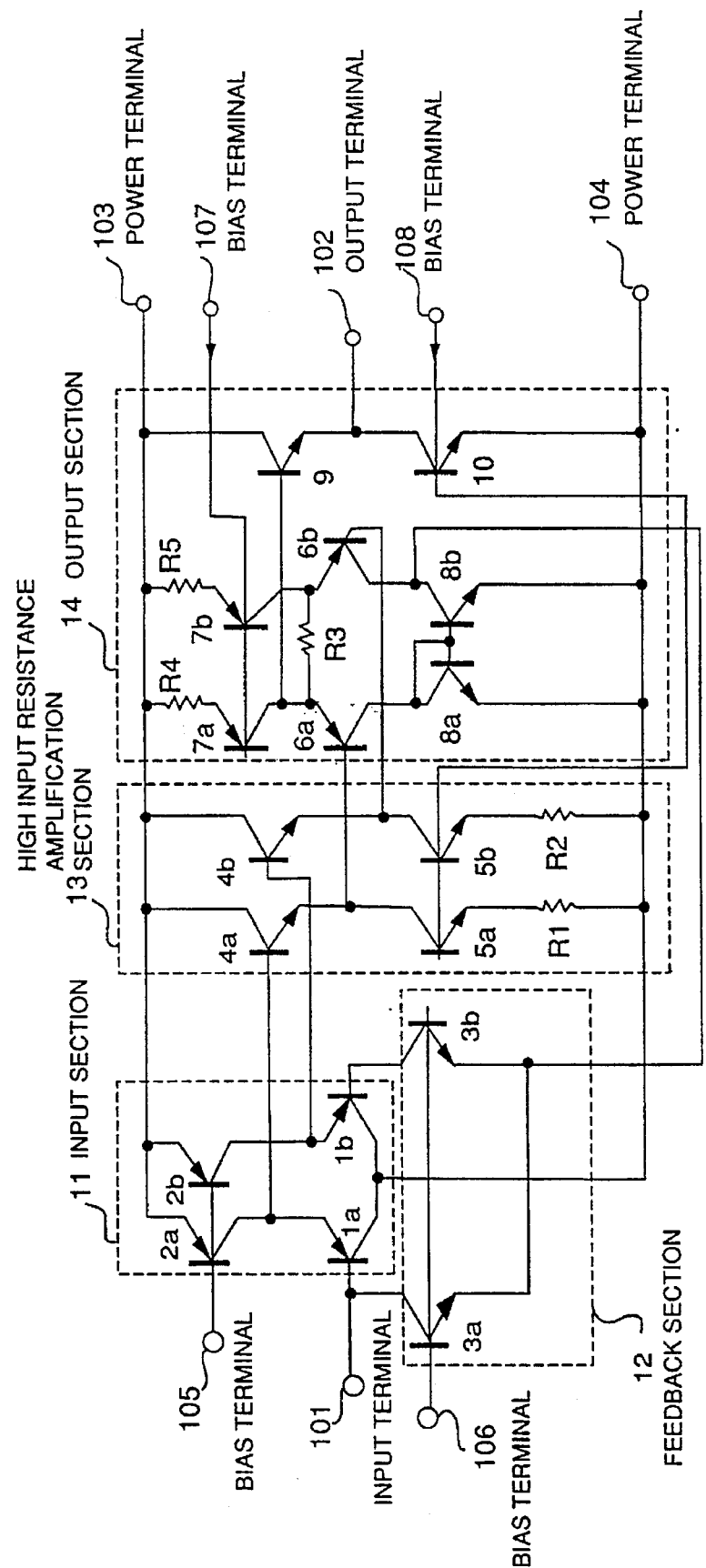
FIG. 1 is a circuit diagram of an embodiment of the present invention.
Figure 2:
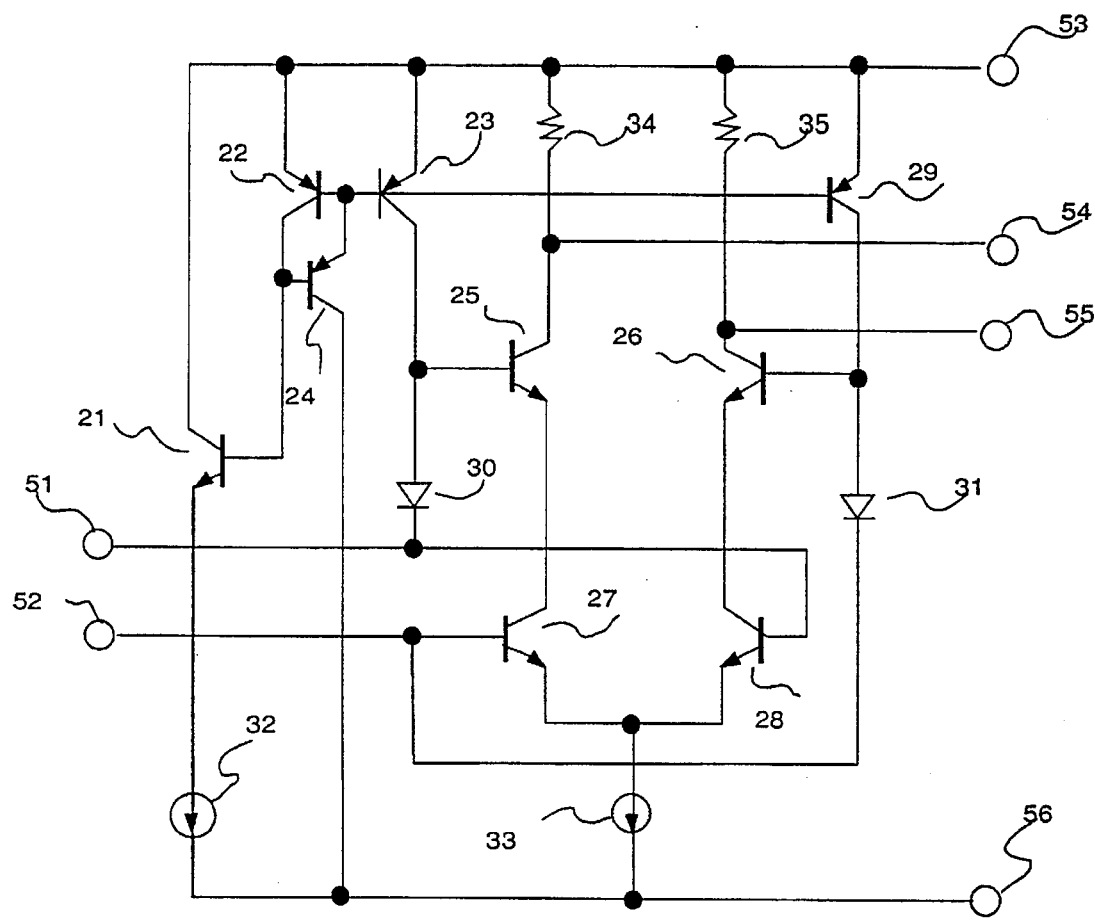
FIG. 2 is a circuit diagram of an example of prior art.

FIG. 1 is a block diagram showing an embodiment of the present invention comprising an input section 11, a feedback section 12, a high input resistance amplifier section 13 and an output section 14.

The input section 11 is a differential amplifier circuit comprising pairs of PNP transistors $1_a$, $1_b$ and $2_a$, $2_b$, each transistor of a pair has the same characteristics. Collectors of the pair of transistors $1_a$ and $1_b$ are connected to a power terminal 104. Emitters of the transistors $1_a$ and $1_b$ are connected to the pair of transistors $2_a$ and $2_b$ serving as an emitter load resistor, respectively. Bases of the pair of transistors $2_a$ and $2_b$ are designed to function as a preset emitter load resistor with bias supplied from a bias terminal 105. An input signal from an input terminal 101 is applied to a base of the transistor $1a$.

The feedback section 12 comprises a pair of NPN transistors $3_a$ and $3_b$, each of them has the same characteristic. Each collector is connected to a base of the transistors $1_a$ and $1_b$ of the input section 11, respectively. Each emitter of the transistors $3_a$ and $3_b$ is connected to a collector of the transistor $8_b$ of the output section 14, thus the feedback circuit is formed. A bias terminal 106 supplies bias to each base.

The high input resistance amplifier section 13 is an emitter follower circuit comprising pairs of NPN transistors $4_a$, $4_b$ and $5_a$, $5_b$, each transistor of a pair has the same characteristics, and resistors $R_1$ and $R_2$. Upon supplying a bias to each base from a bias terminal 108, the pair of transistors $5_a$ and $5_b$ function as an emitter load resistor together with the resistors $R_1$ and $R_2$. A base of the transistor $4_a$ is connected to an emitter of the transistor $1_a$ of the input section 11. While a base of the transistor $4_b$ is connected to an emitter of the transistor $1_b$ of the input section 11.

The output section 14 comprises a differential amplifier circuit formed by pairs of PNP transistors $6_a$, $6_b$, and $7_a$, $7_b$, each transistor of a pair has the same characteristics and a pair of NPN transistors $8_a$ and $8_b$ having the same characteristics and resistors $R_3$, $R_4$ and $R_5$ as well as NPN transistors 9 and 10 at an output stage. When the pair of transistors $7_a$ and $7_b$ receive bias at each base from a bias terminal 107, they function as a preset emitter load resistor together with the resistances $R_4$ and $R_5$. The other pair of transistors $8_a$ and $8_b$ which are connected to each collector of the transistors $6_a$ and $6_b$ respectively forms a current mirror circuit. A collector of the transistor $8_b$ is connected to emitters of the transistors $3_a$ and $3_b$ of the feedback section 12, thus a feedback circuit is formed.

The transistor 9 at output stage is an emitter follower having the transistor 10 as an emitter load resistor. A base of the transistor 9 is connected to an emitter of the transistor $6_a$. An emitter of the transistor 9 is connected to an output terminal 102 and the transistor 10. The transistor 10 functions as an emitter load resistor upon receiving bias from the bias terminal 108. Power terminals 103 and 104 are used for power supply.

Next the operation of the present invention is described.

A signal from the input terminal 101 flows through a path from the transistor $1_a$ of the input section 11 to the transistor $6_a$ of the output section 14 through the transistor $4_a$ of the high input resistance amplifier section 13. While another path is formed by the other side of the transistor pair with the same characteristics, that is, the path is from the transistor $1_b$ of the input section 11 to the transistor $6_b$ of the output section 14 through transistor $4_b$ of the high input resistance amplifier section 13. Each pair of transistors on its path functions in a well-balanced manner.

In each amplifier circuit comprising a pair of transistors of the input section 11, the high input resistance amplifier section 13 and the output section 14, an emitter of each transistor is connected with a load resistor and a base of a transistor at the following stage, where a voltage gain of unity is maintained. The transistors $1_a$ and $1_b$ of the input section 11 are of PNP type, and the transistors $4_a$ and $4_b$ of the high input resistance amplifier section 13 are of NPN type. So a base potential of the transistor $1_a$ of the input section 11 is the same as that of the transistor $6_a$ of the output section 14. The base potential of the transistor $1_b$ of the input section 11 is likewise the same as that of the transistor $6_b$ of the output section 14. Providing the high input resistance amplifier section 13 between the input section 11 and the output section 14 makes the input section 11 function stably irrespective of influences of the output section 14.

In the output section 14, using the transistors $6_a$ and $6_b$ of PNP type, and the transistor 9 of NPN type for the emitter follower of the output stage equalizes an emitter potential of the transistor 9, i.e., potential of the output terminal 102, to a base potential of the transistor $6_a$ of the output section 14. The potential of the input terminal 101 becomes the same as that of the output terminal 102.

Each base of the transistors $1_a$ and $1_b$ of the input section 11 is connected to each collector of the transistors $3_a$ and $3_b$ of the feedback section 12, respectively. Emitters of the transistors $3_a$ and $3_b$ are connected to a collector of the transistor $8_b$ of the output section 14. If the base potential of the transistor $1_a$ has varied by an input signal from the input terminal 101, the base potential of the transistor $6_a$ of the output section 14 also varies. As a result, collector current of the transistor $6_a$ which flows via the transistor $8_a$ varies. The transistors $8_a$ and $8_b$ form the current mirror circuit, which causes the same collector current as that of the transistor $8_a$ to flow in the transistor $8_b$. The emitters of the transistors $3_a$ and $3_b$ which are connected to the collector of the transistor $8_b$ receive a feedback signal for negative feedback, thus stable signals with less distortion are output.

A base of the transistor $1_b$ is directly connected to the collector of the transistor $3_b$, so that no collector current flows in the transistor $3_b$, no base current flows in the transistor $1_b$. Keeping the base current of the transistor $1_b$ from flowing also prevents the base current of the transistor $1_a$ from flowing, resulting in suppressing the current flow to the input terminal 101. Assuming that emitter potential of the transistors $3_a$ and $3_b$ is $V_e$, and bias potential supplied to the base of the transistors $3_a$ and $3_b$ is $V_b$, bias supply by keeping the condition of $V_e<V_b$ suppress the current flow to the input terminal 101, thus high input resistance is obtained.

In the aforementioned invention, an input stage is provided with a differential amplifier circuit comprising a pair of transistors with the respective emitter connected to the same load resistor. Then a pair of emitter follower circuits at high input resistance are provided. An output stage is provided with a differential amplifier circuit comprising a pair of transistors with the respective emitters connected to the same load resistor and the respective collectors connected to current mirror circuits. Each base of the differential amplifier circuit of the input stage is connected to a feedback transistor for executing negative feedback from the output stage. Collector current is kept from flowing by supplying bias to the base of the feedback transistor so as to suppress sufficient amount of base current of the pair of transistors of the differential amplifier circuit of the input stage. This may also realize a stable buffer amplifier at high input resistance with the semiconductor integrated circuit. Using PNP type and NPN type transistors may form the buffer amplifier by which the potential of the input terminal is the same as that of the output terminal, resulting in gain set to a value 1.

What is claimed is:

1. A semiconductor integrated circuit comprising:
   an input section for amplifying an input signal;
   a high input resistance section coupled to said input section and causing said input section to have a voltage gain of approximately unity;
   an output section for producing a negative feedback signal of an output of said high input resistance section; and
   a feedback section for receiving said feedback signal and for suppressing an electric current flowing from said input section by supplying a preset bias in accordance with a voltage of said feedback signal.

2. The semiconductor integrated circuit of claim 1, having said input section comprising:
   a differential amplification circuit including first and second transistors whose collectors are connected to each other; and
   first and second load resistance means respectively connected to the emitters of said first and second transistors, wherein
   a base of one of said first and second transistors is connected to an input terminal.

3. The semiconductor integrated circuit of claim 2, wherein said first and second transistors are of PNP type and have the same characteristics.

4. The semiconductor integrated circuit of claim 1, having said high input resistance section comprising an emitter follower circuit connected with an output side of said input section.

5. The semiconductor integrated circuit of claim 4, wherein said emitter follower circuit comprises first and second transistors which are of NPN type and which have the same characteristics.

6. The semiconductor integrated circuit of claim 1, wherein said output section comprises:

a differential amplification circuit including first and second transistors connected to an output side of said high input resistance section; and first and second load resistance means respectively connected to emitters of said first and second transistors; and a current mirror circuit connected to the collectors of said first and second transistors.

7. The semiconductor integrated circuit of claim 6, wherein said first and second transistors are of PNP type and have the same characteristics.

8. The semiconductor integrated circuit of claim 1, having said feedback section comprising first and second transistors whose emitters receive said negative feedback signal from said output section, wherein each base of said first and second transistors is supplied a preset bias to prevent current from flowing to said input section through said feedback section.

9. The semiconductor integrated circuit of claim 8, comprising said first and second transistors of NPN type with the same characteristics.

10. A semiconductor integrated circuit comprising:

an input section having a first differential amplification circuit including first and second transistors, and first and second load resistance means connected to emitters of said first and second transistors, respectively;

a high input resistance section having an emitter follower circuit connected to an output side of said first differential amplification circuit;

an output section having a second differential amplification circuit including third and fourth transistors connected to an output side of said high input resistance section, third and fourth load resistance means connected to emitters of said third and fourth transistors, respectively, and a current mirror circuit connected to each collector of said third and fourth transistors, said current mirror circuit providing a negative feedback signal; and a feedback section having fifth and sixth transistors, wherein a collector of the fifth transistor is connected to the base of the first transistor and a collector of the sixth transistor is connected to the base of the second transistor, the bases of the fifth and sixth transistors being supplied with a bias to prevent a collector current from flowing through the fifth and sixth transistors and the emitters of said fifth and sixth transistors being supplied with said negative feedback signal.

11. The semiconductor integrated circuit of claim 10, wherein said first and second transistors have the same characteristics and are of the PNP type, the collectors of the first and second transistors are connected to each other, and the base of said first transistor is connected to an input terminal; and wherein said first load resistance means comprises a seventh transistor whose collector is connected to the emitter of the first transistor, said second load resistance means comprises an eighth transistor whose collector is connected to the emitter of the second transistor, and the bases of the seventh and eighth transistors are supplied with a preset bias.

12. The semiconductor integrated circuit of claim 10, wherein said emitter follower circuit comprises a seventh transistor and an eighth transistor, which have the same characteristics and are of NPN type, wherein the base of the seventh transistor is connected to the emitter of the first transistor and the base of the eighth transistor is connected to the emitter of the second transistor; and a ninth transistor and a tenth transistor, wherein each base thereof is supplied a preset bias, and the collector of the ninth transistor is connected to the emitter of the seventh transistor and the collector of the tenth transistor is connected to the emitter of the eighth transistor.

13. The semiconductor integrated circuit of claim 10, wherein the third and fourth transistors have the same characteristics and are of PNP type, wherein bases of the third and fourth transistors are connected with the output side of said high input resistance section;

said third load resistance means comprises a seventh transistor whose collector is connected to the emitter of the third transistor, said fourth load resistance means comprises an eighth transistor whose collector is connected to the emitter of the fourth transistor, and the bases of the seventh and eighth transistors are supplied with a preset bias;

said current mirror circuit comprising a ninth transistor and a tenth transistor, which have the same characteristics and are of NPN type, wherein the collector of the ninth transistor is connected to the collector of the third transistor and the collector of the tenth transistor is connected to the collector of the fourth transistor, the collector of the tenth transistor supplying the negative feedback signal; and said output section further comprising: an eleventh transistor whose base is connected with the emitter of said third transistor; and a fifth load resistance means, the emitter of the eleventh transistor being connected to said fifth load resistance means and to an output terminal.

14. A semiconductor integrated circuit comprising:

a first transistor and a second transistor, which have the same characteristics, wherein collectors of the first and second transistors are connected to each other and the emitters of the first and second transistors are connected to a first load resistance means to form a differential amplifier circuit;

a third transistor and a fourth transistor, which have the same characteristics, wherein emitters of the third and fourth transistors are connected to each other, the collector of the third transistor is connected to the base of the first transistor and the collector of the fourth transistor is connected to the base of the second transistor, and the bases of the third and fourth transistors are supplied with a preset bias;

a fifth transistor and a sixth transistor, which have the same characteristics, wherein a base of the fifth transistor is connected to the emitter of the first transistor and a base of the sixth transistor is connected to the emitter of the second transistor, and the emitters of the fifth and sixth transistors are connected to a second load resistance means to form an emitter follower circuit;

a seventh transistor and eighth transistor, which have the same characteristic, wherein a base of the seventh transistor is connected to the emitter of the fifth transistor and a base of the eighth transistor is connected to the emitter of the sixth transistor, the emitters of the seventh and eighth transistors are connected to a third load resistance means, and the collectors of the seventh and eighth transistors are connected to a current mirror circuit including ninth and tenth transistors to form a differential amplifier circuit; and an eleventh transistor whose base is connected to the emitter of said seventh transistor and whose emitter is connected to a fourth load resistance means and an output terminal to function as an emitter follower, wherein the base of said first transistor is connected with an input terminal, the emitters of said third transistor and said fourth transistor are connected to the collector of said eighth transistor, and said preset bias supplied to said third transistor and said fourth transistor is set so as to prevent collector currents from flowing through collectors of said third transistor and said fourth transistor.

15. The semiconductor integrated circuit of claim 14, wherein said first transistor and said second transistor are of PNP type;

said third transistor and said fourth transistor are of NPN type;

said fifth transistor and said sixth transistor are of NPN type;

said seventh transistor and said eighth transistor are of PNP type;

and said eleventh transistor is of NPN type.

16. A method of compensating a base current in a differential amplification circuit comprising steps of:

equalizing each base potential of a pair of transistors forming a differential amplification circuit in an input section to each base potential of a pair of transistors forming a differential amplification circuit in an output section;

producing a negative feedback signal from said differential amplification circuit in said output section;

supplying the negative feedback signal to a pair of transistors forming a feedback section as an emitter current; and connecting the collector of one of the transistors of said pair of transistors of said feedback section with the base of one of the transistors of said pair of transistors forming said differential amplification circuit in said input section, connecting the collector of the other of the transistors of said pair of transistors of said feedback section with the base of the other of the transistors of said pair of transistors forming said differential amplification circuit in said input section, and supplying a preset bias to each base of said pair of transistors in said feedback section so as to prevent collector current from flowing through the collectors of the pair of transistors of said feedback section.

17. A method of compensating a base current in a differential amplification circuit of claim 16, further comprising the steps of:

forming said pair of transistors of said differential amplification circuit in said input section with PNP type transistors; and providing a pair of NPN transistors coupled between said differential amplification circuit in said input section and said differential amplification circuit in said output section.

\* \* \* \* \*